(12) United States Patent
Lee

(10) Patent No.: US 6,333,224 B1
(45) Date of Patent: Dec. 25, 2001

(54) METHOD FOR FABRICATING AN INTEGRATED CIRCUIT CAPACITOR

(75) Inventor: Ki-Young Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/547,711

(22) Filed: Apr. 11, 2000

(30) Foreign Application Priority Data

Aug. 26, 1999 (KR) .................................................. 99-35593

(51) Int. Cl.[7] ...................... H01L 21/8242; H01L 21/20; H01L 21/4763
(52) U.S. Cl. .......................... 438/243; 438/381; 438/239; 438/640; 438/673; 438/978
(58) Field of Search ..................... 438/243, 381, 438/239, 640, 978, 673, 584, 238, 241, 240, 250, 244, 253, 251, 252, 254, 255, 256, 393–398; 257/776

(56) References Cited

U.S. PATENT DOCUMENTS

| | | | |
|---|---|---|---|
| 5,789,303 | * 8/1998 | Leung et al. ........................ | 438/381 |
| 5,811,353 | * 9/1998 | Nanjo .................................. | 438/666 |
| 5,874,359 | * 2/1999 | Liaw et al. .......................... | 438/640 |
| 5,882,488 | * 3/1999 | Leiphart ......................... | 204/192.32 |
| 5,933,749 | * 8/1999 | Lee ...................................... | 438/435 |
| 6,054,360 | * 4/2000 | Watanabe ............................ | 438/396 |
| 6,103,623 | * 8/2000 | Lien et al. .......................... | 438/669 |
| 6,143,649 | * 11/2000 | Tang .................................... | 438/640 |
| 6,150,206 | * 11/2000 | Oh ....................................... | 438/238 |
| 6,184,551 | * 2/2001 | Lee et al. ............................ | 257/310 |
| 6,190,956 | * 2/2001 | Sze et al. ............................ | 438/239 |
| 6,214,723 | * 4/2001 | Kamoshima et al. ............... | 438/653 |
| 6,239,010 | * 5/2001 | Lu ........................................ | 438/592 |
| 6,251,740 | * 6/2001 | Johnson et al. ..................... | 438/381 |
| 6,258,640 | * 7/2001 | Miyazaki ............................ | 438/197 |
| 6,261,893 | * 7/2001 | Chang et al. ....................... | 438/238 |
| 6,274,936 | * 8/2001 | Howard ............................... | 257/776 |

* cited by examiner

Primary Examiner—Matthew Smith
Assistant Examiner—Chuong A Luu
(74) Attorney, Agent, or Firm—Law Offices of Eugene M. Lee, PLLC

(57) ABSTRACT

A method for fabricating a MIM capacitor of a MDL logic or analog circuit of a semiconductor device. A conductivity layer is formed on a semiconductor substrate having a first inter-level insulating layer. A capping metal layer having an etching rate higher than an oxide layer is formed on the conductivity layer. A lower electrode comprising a "conductivity layer/capping metal layer" deposition is formed by selectively etching the capping metal layer and the conductivity layer in order to expose a predetermined part of the surface of the first inter-level insulating layer. A second inter-level insulating layer is formed on the first inter-level insulating layer covering the lower electrode. A via hole is formed by selectively etching both the second inter-level insulating layer and the lower electrode thereby to expose a portion of the lower electrode so that a tapered capping metal layer remains along the lower edges of the via hole. A dielectric layer, devoid of step coverage defects and concentrated electric fields, is inserted in the via hole between the lower and upper electrodes thereby preventing current leakage and short circuits at portions of the dielectric layer. This has the beneficial effect of substantially improving product yield and reliability.

22 Claims, 7 Drawing Sheets

METHOD FOR FABRICATING AN INTEGRATED CIRCUIT CAPACITOR

BACKGROUND OF THE INVENTION

1. Field of the Invention

The present invention relates to a method of fabricating an integrated circuit capacitor, and more particularly to a method of fabricating a capacitor in a metal-insulator-metal (MIM) structure used in logic or analog circuits of merged dynamic random access memory (DRAM) and logic (MDL) devices.

2. Description of the Prior Art

Semiconductor integrated circuits are generally classified as digital or analog. Digital type integrated circuits (e.g., logic circuits) produce an output according to the state(s) of one or more input signals, whereas analog type integrated circuits (e.g., analog circuits) produce an output according to linearly varied changes in an input signal.

In digital and analog type integrated circuits, data is stored according to the presence or absence of charge accumulated at a capacitor. In order to maintain normal response characteristics, the capacitor should be fabricated in a way that prevent its capacitance from varying with changes in voltage or temperature.

Different from general metallic oxide semiconductor field-effect transistors (MOSFETs) or junction capacitors, MDL capacitors having a polysilicon-insulator-polysilicon (PIP) or metal-insulator-metal (MIM) structure have been proposed because their capacitance does not depend on bias voltage or temperature.

Thin film MIM capacitors, however, do not provide high unit area capacitance in comparison with the PIP capacitors. In addition, MIM capacitors have a lower voltage coefficient of capacitance (VCC), which indicates variation of capacitance according to changes in voltage. They also have a lower temperature coefficient of capacitance (TCC), which indicates variation of capacitance according to changes in temperature. PIP capacitors, for instance, have VCC and TCC values of about 220 parts per million/volt (ppm/V) and 120 parts per million/degree Celsius (ppm/C), respectively, but those of MIM capacitors are about 60 ppm/V and 70 ppm/C, respectively. As a result, MIM capacitors have been used for fabricating precise analog products. In recent years, however, there has been a tendency to use MIM capacitors to make logic and analog circuits.

FIGS. 1a through 1g are sequential processing diagrams illustrating a widely used conventional method of fabricating MIM capacitors of a logic or analog circuit of an MDL device. The method will be described with reference to accompanying drawings.

As shown in FIG. 1a, a first inter-level insulating layer 12 is formed on a semiconductor substrate 10 having a lower structure (not shown) consisting of transistors, predetermined wires, and the like.

As shown in FIG. 1b, a first conductivity layer 14 of aluminum (Al) is formed on the first inter-level insulating 12. A capping metal layer of titanium nitride (TiN) 16 is formed to a thickness of about 200 to 600 angstroms (Å) on the first conductivity layer 14. A photo resist layer (not shown) defining capacitor regions is used as a mask for sequentially etching the capping metal layer 16 and the first conductivity layer 14, thereby forming a "first conductivity 14/capping metal layer 16" deposition structure defining a lower electrode (I).

As shown in FIG. 1c, a second inter-level insulating layer 18 is formed on the first inter-level insulating layer 12 of the lower electrode (I). Then, a chemical mechanical polishing (CMP) or etch-back process is performed to planarize the second inter-level insulating layer 18. Accordingly, in order to expose predetermined portions of the surface of the first conductivity layer 14 of the lower electrode (I), the second inter-level insulating layer 18 and capping metal layer 16 are selectively etched to form a via hole or cavity (h) in the insulating layer 18. In this process, a portion of the first conductivity layer 14 is simultaneously etched away to form a recessed portion in the first conductivity layer 14 on the bottom surface of the via hole (h).

As shown in FIG. 1d, a dielectric layer 20 is formed over the second interlevel insulating layer 18 covering the via hole (h) and a thin blocking metal layer 22 is formed by a "titanium/titanium nitride" ("Ti/TiN") deposition on the dielectric layer 20.

As shown in FIG. 1e, a second conductivity layer of tungsten (W) is formed on the structure in order to completely fill in the via hole (h). A CMP or etch-back process is performed on the second conductivity layer in order to expose the surface of the blocking metal layer 22, thereby forming a conductivity plug 24 of W in the via hole (h).

As shown in FIG. 1f, a third conductivity layer 26 of Al alloy is formed on the blocking metal layer 22 having conductivity plug 24. A photo resist pattern (not shown) defining capacitor regions is used as a mask for sequentially etching the third conductivity layer 26, blocking metal layer 22, and the dielectric layer 20 in order to expose predetermined portions of the surface of the second inter-level insulating layer 18. As a result, a conductivity layer of a predetermined size defines an upper electrode (II), thereby completing the fabrication process.

As a consequence, the dielectric layer 20 lies between the "conductivity plug 24/conductivity layer 26" deposition structure of the upper electrode (II) on the top thereof and the "conductivity layer 14/capping metal layer 16" deposition structure of the lower electrode (I) on the bottom thereof, which forms the MIM capacitor. As described above, the capping metal layer 16 is made of TiN and both edges where the dielectric layer 20 and the lower electrode (I) are contacted is formed in a sharply angled structure.

However, if an MDL capacitor is fabricated by the aforementioned method, problems may occur. These problems are described below.

In forming the via hole (h), the etching process is performed vertically downward to the capping metal layer 16 of the lower electrode (I). When the etching process is completed, the lower and lateral surfaces of the via hole (h) meet in a perpendicular relationship (e.g., at a right angle) at the bottom of via hole (h). FIG. 1g shows an enlarged partial perspective view of the affected area, including the lower surface of the via hole (h).

Along the lower edge of the via hole (h) in the region of the dielectric layer 20 meeting at an angle, there may also exist a step coverage defect, which is manifested by a thinner dielectric layer 20 compared to other regions of the via hole (h).

Current leakage may occur at the step coverage defect during operation of the device. Even worse, a short circuit may occur between upper and lower electrodes, thereby damaging the capacitor and reducing the yield during production of such semiconductor devices.

In addition, the dielectric layer 20 at the step coverage defect is exposed to higher electric field strengths, i.e., called "concentration of electric field," which occurs in the operating device thereby lowering reliability of products incorporating the fabricated device. Therefore, there is an urgent demand to solve the aforementioned problems.

SUMMARY OF THE INVENTION

In view of the above, it is a feature of the present invention to provide a method for fabricating a capacitor of a semiconductor integrated circuit by forming a capping metal layer of "Ti/TiN" or "Ti/TiW" depositions which have a higher etching rate than an oxide layer, and by performing an etching process at lower edges of a via hole in a tapered manner in order to equalize or smooth the thickness of the dielectric layer at the bottom of the via hole, thereby preventing reduction in yield due to step coverage defects and improving reliability of devices otherwise subjected to a concentration of electric fields.

In order to accommodate the aforementioned feature, there is provided a method for fabricating a capacitor of a semiconductor integrated circuit comprising the steps of forming a conductivity layer on a semiconductor substrate having a first inter-level insulating layer; forming a capping metal layer with a higher etching rate than an oxide layer on the conductivity layer; forming a lower electrode in a "conductivity layer/capping metal layer" deposition structure by etching the capping metal layer and the conductivity layer to expose a predetermined part of the surface of the first inter-level insulating layer; forming a second inter-level insulating layer on the first inter-level insulating layer having the lower electrode; forming a via hole by etching the second inter-level insulating layer and the capping metal layer to expose a predetermined portion of the surface of the lower electrode, wherein a tapered capping metal layer remains along the lower edges of the via hole; and forming an upper electrode and inserting a dielectric layer in at least a portion of the via hole.

A collimator containing a sputtering unit is used to form by deposition the "Ti/TiN" or "Ti/TiW" capping metal layer, wherein Ti deposition preferably has a thickness of about 50 to 500 Å and the TiN or TiW deposition preferably has a thickness of about 100 to 1500 Å.

Furthermore, either a dry etching process or a complex process including a combination of wet and dry etching processes may be used to form the via hole (h). Etching gases CHF3 and CF4 having a mixing ratio of one to X, that is, $CHF_3:CF_4=1:X$ (where X=0.5 to 2), are used for the dry etching process. The via hole is preferably formed at a horizontal distance of about 100 to 800 Å from the remaining capping metal layer along the edge of its lower surface.

If a MIM capacitor is fabricated according to the present invention, the difference in the selective etching rate between the second inter-level insulating layer and the capping metal layer prevents the capping metal layer from being vertically etched. Instead, the capping metal layer is etched in a tapered fashion, thereby achieving rounded lower edges at the lower portion of the via hole. Accordingly, forming the dielectric layer as aforementioned provides a dielectric layer having a more even thickness thereby preventing concentration of an electric field at particular portions of the dielectric layer, as well as preventing step coverage defects in the dielectric layer.

BRIEF DESCRIPTION OF THE DRAWINGS

Other features and aspects of the invention will become apparent from the following description with reference to the accompanying drawings in which.

DETAILED DESCRIPTION OF THE PRESENT INVENTION

Korean patent application number 99-35593, filed on Aug. 26, 1999, entitled "Method for Fabricating Capacitor of Semiconductor Integrated Circuit" is incorporated herein by reference.

An illustrative embodiment of the present invention is described in detail with reference to accompanying drawings.

FIGS. 2a through 2f show sequential processing diagrams illustrating a method for fabricating a MIM capacitor of a logic circuit or an analog circuit of MDL in accordance with the present invention.

Figure 1A:
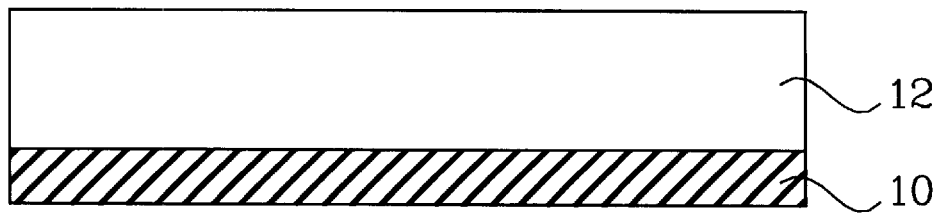
FIGS. 1a through 1g are sequential processing diagrams that illustrate a method for fabricating a MIM capacitor of a logic or analog circuit of MDL in accordance with the prior art.
Figure 1B:
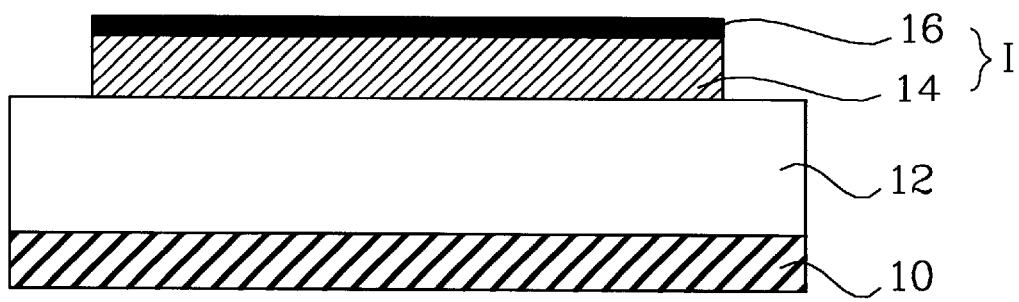
Figure 1C:
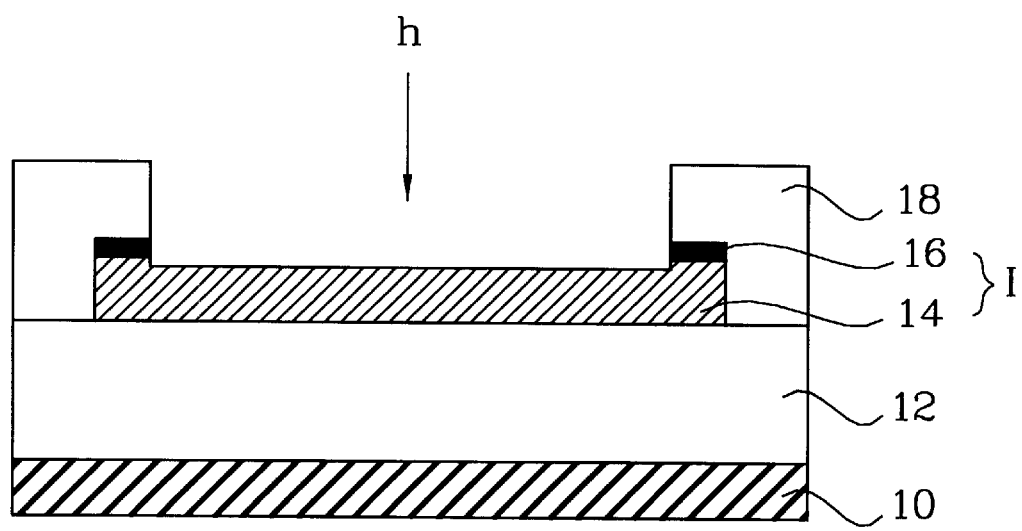
Figure 1D:
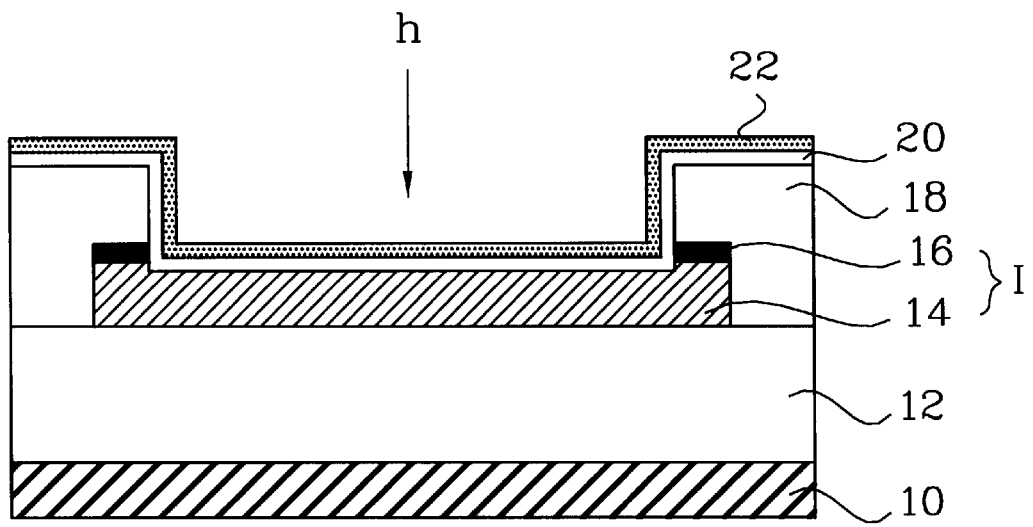
Figure 1E:
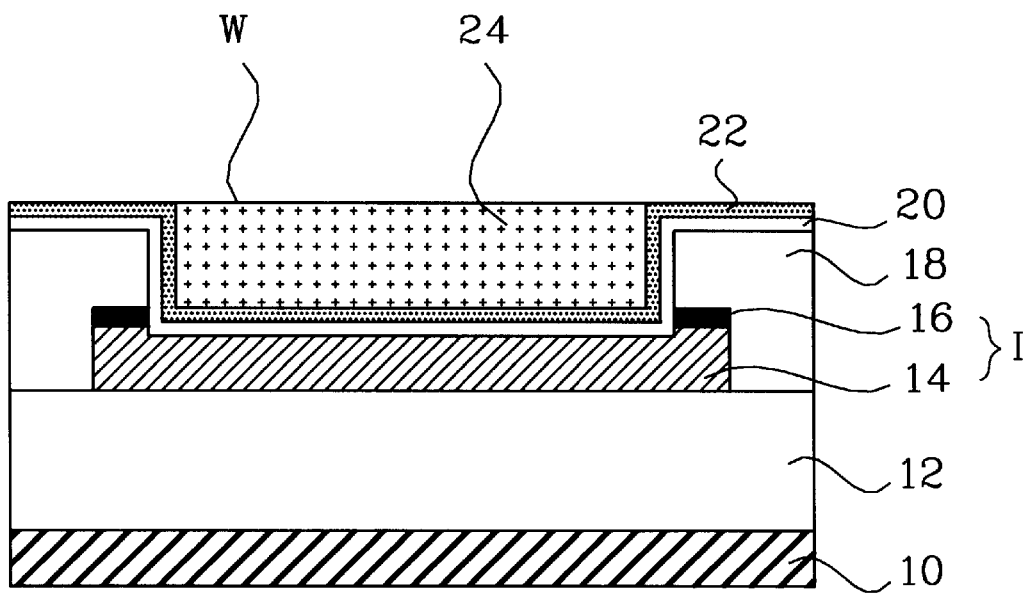
Figure 1F:
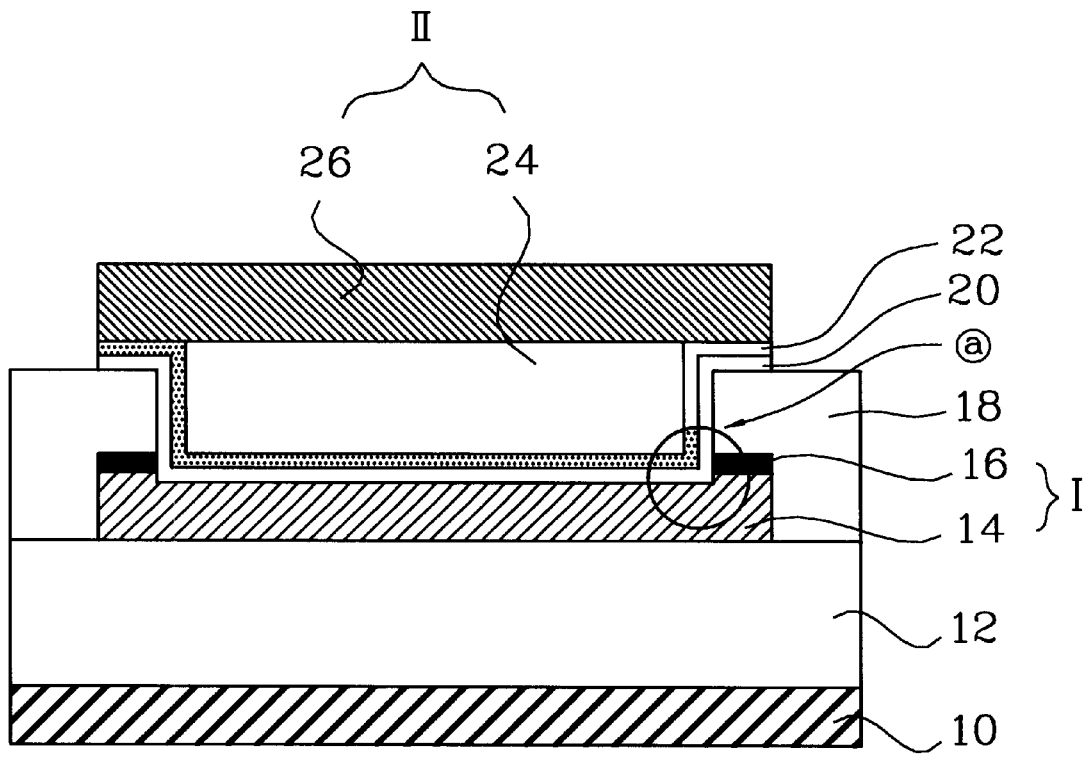
Figure 1G:
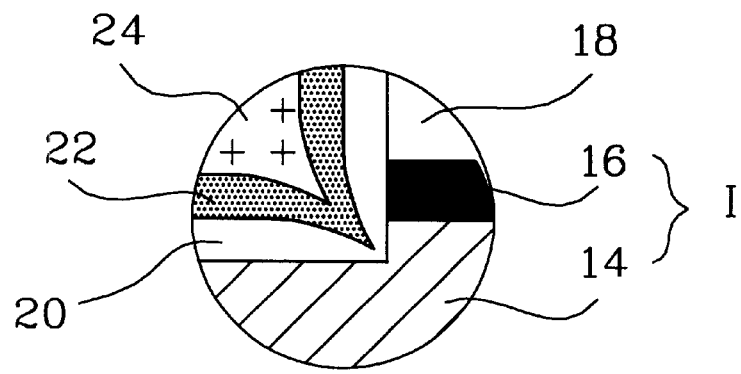
Figure 2A:
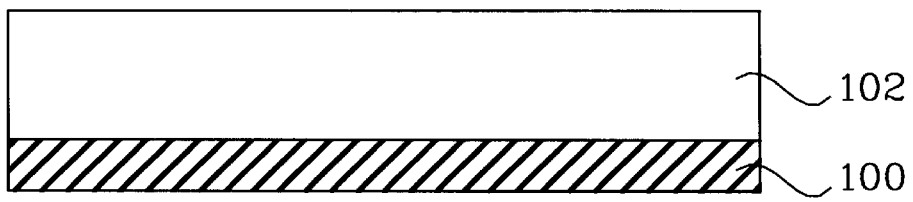
FIGS. 2a through 2f are sequential processing diagrams that illustrate a method for fabricating a MIM capacitor of a logic circuit or an analog circuit of MDL in accordance with the present invention.

As shown if FIG. 2a, a first inter-level insulating layer 102, such as an oxide layer, is formed on a semiconductor substrate 100 having a lower structure (not show) comprised of transistors, conductors, and the like, through CVD, thermal diffusion, layer deposition, or a combination of these processes. The first inter-level insulating layer formed by a chemical vapor deposition (CVD) process, for example, includes a single-layer structure of borophosphosilicate glass (BPSG), phosphosilicate glass (PSG), plasma enhanced oxide (PEOX), USG, PE-TEOS, $O_3$-TEOS, or SOG or a multi-layer structure thereof. The first inter-level insulating layer formed by thermal diffusion is a high temperature oxidation (HTO) layer.

Figure 2B:
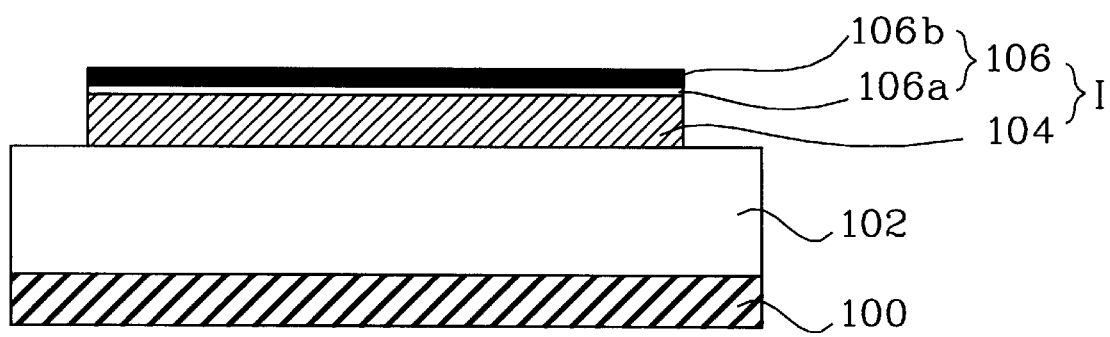

As shown in FIG. 2b, a first conductivity layer 104 of aluminum Al, tungsten W, or copper (Cu) alloy is formed on the first inter-level insulating layer 102. A "Ti(106a)/TiN (106b)" composite deposition structure of a capping metal layer 106 having a higher selective etching rate than an oxide layer, is formed on the first conductivity layer 104 by using a collimator containing sputtering unit. At this time, TiN(106b) can be replaced with TiW to form the capping metal layer 106. Further, Ti(106a) deposition is preferably deposited to a thickness of about 50 to 500 Å, and the TiN(106b) or TiW deposition is preferably deposited to a thickness of about 100 to 1500 Å. Then, a photo resist layer (not shown) having a pattern defining capacitor regions is used as a mask for sequentially etching the capping metal layer 106 and the first conductivity layer 104, thereby forming a "first conductivity 104/capping metal layer 106" deposition structure of lower electrode (I).

Figure 2C:
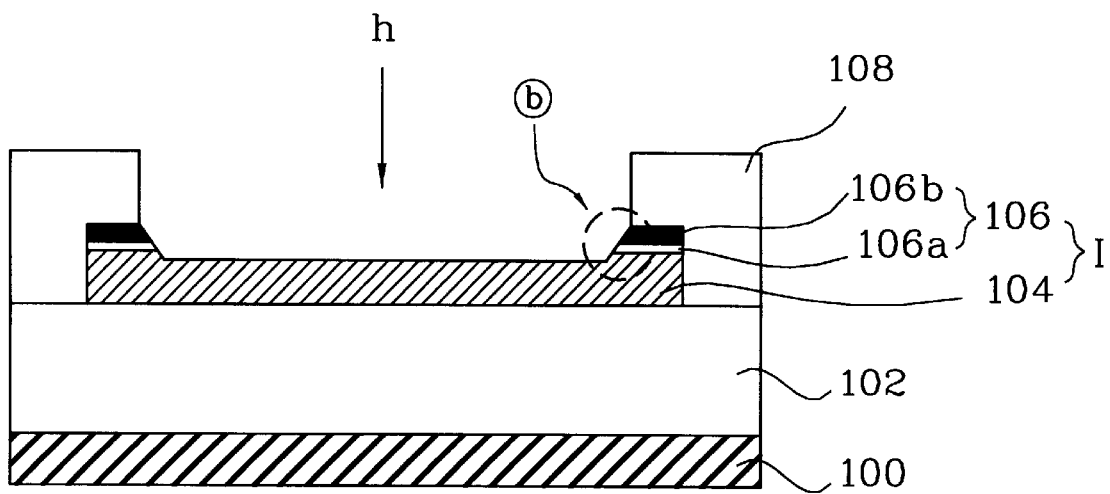

As shown in FIG. 2c, a second inter-level insulating layer 108 is formed on the first inter-level insulating layer 102 of the lower electrode I and then a CVD or a general layer deposition process is performed in order to form a second interlevel insulating layer 108, which is planarized by a CMP or etch-back process. Accordingly, in order to expose a predetermined portion of the surface of the first conductivity layer 104 of the lower electrode I, the second inter-level insulating layer 108 and the capping metal layer 106 are dry-etched to form a via hole (h) in the insulating layer 108. In this process, a portion of the first conductivity layer 104 is simultaneously etched away to form a recessed portion of the first conductivity layer 104 on the bottom surface of the via hole (h) after completing formation of the via hole. At this time, an etching gas mixture of $CHF_3$ and $CF_4$ having a ratio of one to X, that is, $CHF_3:CF_4=1:X$ (where X=0.5 to 2), is used for the dry etching process in order to form the via hole (h). A complex etching process combining wet and dry processes can also be used to form the via hole (h).

As shown in FIG. 2c, to form the via hole (h) under process conditions described herein, the second inter-level insulating layer 108 is vertically etched, but the capping metal layer 106 is taper-etched due to its own characteristics. After completion of the etching process, there remains a tapered shape of the capping metal layer 106 along the edge of the bottom surface of the via (h).

Figure 3:
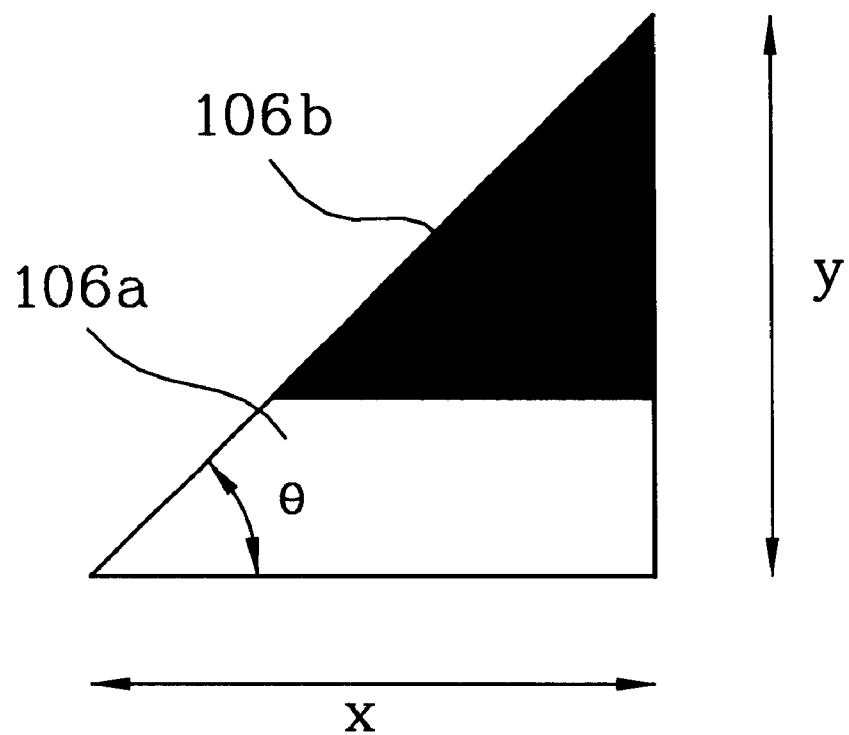
FIG. 3 is an enlarged partial perspective view that illustrate segment (b) shown in FIG. 2c.

FIG. 3 shows an enlarged partial perspective view illustrating a tapered part of the capping metal layer 106 remaining along the bottom edge of the via hole (h).

In FIG. 3, reference X designates a horizontal distance between a lateral side of the via hole (h) and the tapered part, and reference Y designates a vertical distance, i.e., the total thickness of the capping metal layer. An angle relative to the vertical distance Y of the capping metal layer 106 is preferably kept at an angle of 20 to 80 degrees by controlling the thickness of Ti(106a) and TiN(106b) layers which comprise the capping metal layer 106. The horizontal distance X preferably ranges between 100 and 800 Å.

The etching process described and illustrated above is performed to a point where the surface of the first conductivity layer 104 is exposed to form the via hole (h). It can also be done by etching the center of the capping metal layer 106. If the center of capping metal layer 106 is etched, then the first conductivity layer 104 is not exposed at the bottom surface of the via hole (h) and the thickness Y of the capping metal layer of the tapered part may be smaller than in the former case.

Figure 2D:
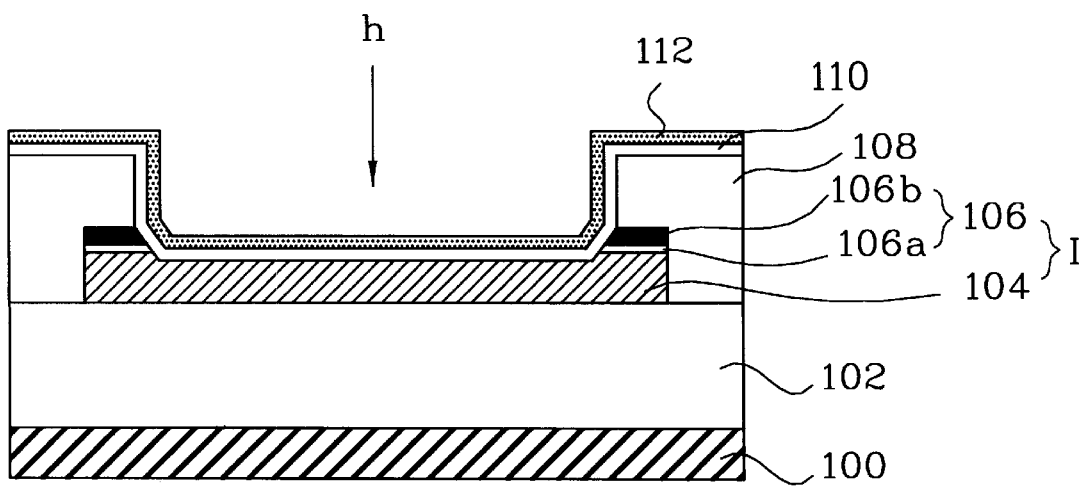

As shown in FIG. 2d, a dielectric layer 110 of a predetermined thickness is formed on the second inter-level insulating layer 108 covering the internal portion of the via hole (h). A "Ti/TiN" deposition comprising a blocking metal layer 112 is formed on the dielectric layer 110 by using the collimator containing sputtering unit. At this time, the dielectric layer 110 is formed as a single oxide layer (for instance, PEOX, P—$SiH_4$ or high density plasma (HDP), $Al_2O_3$) or a nitride layer (for instance, plasma enhanced nitride (PESiN), or a multi-layer structure thereof (for instance, "oxide layer/nitride layer," "nitride layer/oxide layer," "oxide layer/nitride layer/oxide layer" or "nitride layer/oxide layer/nitride layer")).

Figure 2E:
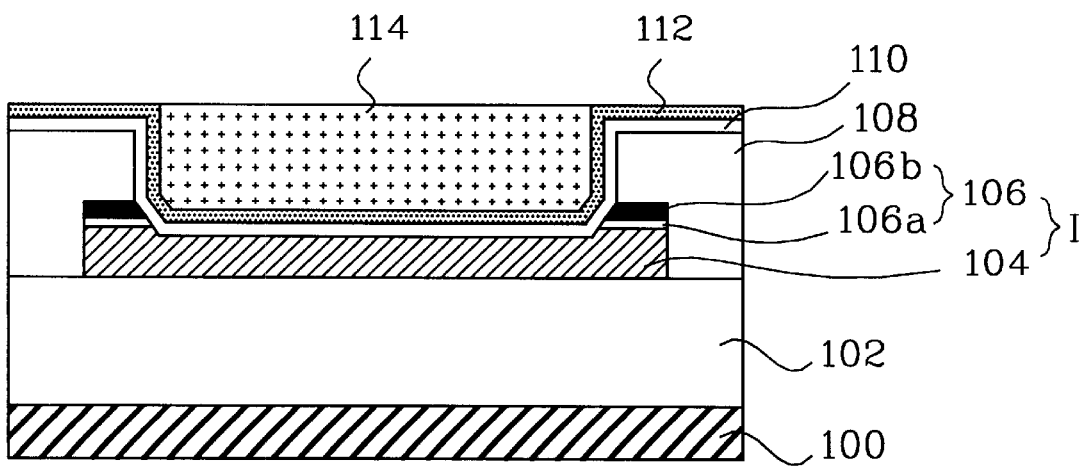

As shown in FIG. 2e, a second conductivity layer of tungsten W is formed on the resultant structure of the previous processes for filling in the via hole (h) by using the CVD process. A CMP or etch-back process is performed on the second conductivity layer to expose the surface of the blocking metal layer 112, thereby forming a conductivity plug 114 of W in the via hole (h).

Figure 2F:
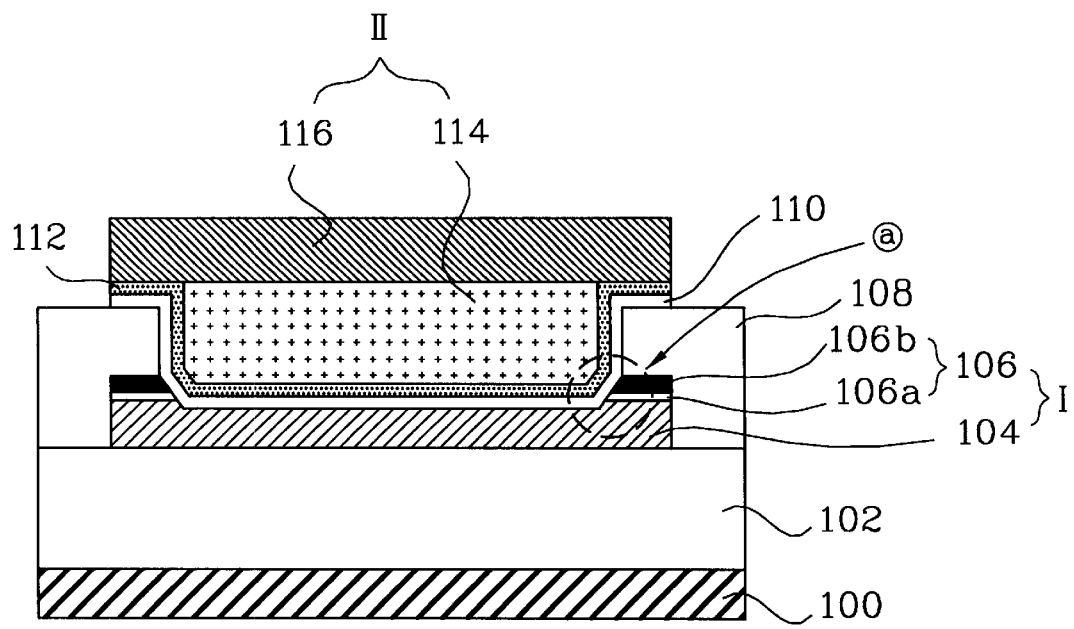

As shown in FIG. 2f, a third conductivity layer 116 of Al, W or Cu alloy is formed on the blocking metal layer 112 having the conductivity plug 114. A photo resist layer pattern (not shown) defining the capacitor region is used as a mask for sequentially etching the third conductivity layer 116, the blocking metal layer 112, and the dielectric layer 110 in order to expose a predetermined portion of the surface of the second inter-level insulating layer 108. As a result, a conductivity layer 116 of a predetermined size defines an upper electrode II, thereby completing the fabrication process.

As a consequence, the dielectric layer 110 is positioned between "conductivity plug 114/conductivity layer 116" deposition structure of the upper electrode II on the top thereof and the "conductivity layer 104/capping metal layer 106" deposition structure of the lower electrode I on the bottom thereof. A MIM capacitor is formed through the aforementioned fabrication process. At this time, as described above, the capping metal layer 106 has a "Ti/TiN" or "Ti/TiW" deposition structure, and both edges, where the dielectric layer 110 and the lower electrode I are contacted, are formed in a tapered round shape.

If the MIM capacitor is fabricated as such, the difference in selective etching rate between the oxide layer of the second inter-level insulating layer 108 and the capping metal layer results in different etching processes in order to form the via hole, that is, the former oxide layer is vertically etched and the latter capping metal layer is taper-etched. Therefore, when the via hole (h) is formed, a tapered round shape, not a sharply angled shape, is formed at both edges bordering the lower and lateral surfaces of the via hole (h).

Therefore, if the herein described process (for instance, a process for depositing the dielectric layer) is performed in making the capacitor, step coverage defects may be avoided because the dielectric layer 110 is formed thinner at particular portions (for instance, at the lower edges of the via hole (h)) than at the rest of the internal portion of the via hole (h). In other words, a dielectric layer 110 having an equal thickness is formed over the internal portion of the via hole (h). A part (a) of FIG. 2f is enlarged in FIG. 2g, which shows an expanded view a dielectric layer 110 of even thickness having been formed along the lower edge of the via hole (h).

Accordingly, the present invention is effective in preventing current leakage caused by step coverage defects in the dielectric layer 110 and damage caused by electrical short circuits between upper and lower electrodes (I and II), thereby improving product yield and reliability.

In addition, because the thickness of the dielectric layer 110 is more even, an more equal electric field is formed over the dielectric layer of the operating device. As a result, defects caused by concentration of electric fields are prevented, thereby making the capacitor of the present invention a more desirable product with high reliability.

Figure 2G:
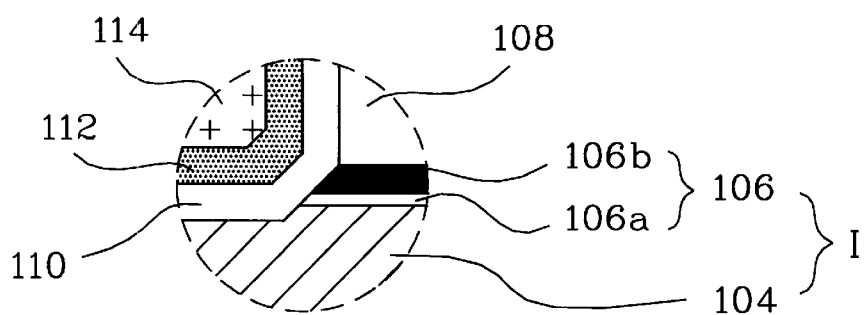

On the other hand, the processes of fabricating the upper electrode II, shown in FIGS. 2e and 2g, can be modified in another embodiment of the present invention, where a conductivity layer is formed on a blocking metal layer 112 for filling in the via hole (h) through an Al re-flow process, without a separate layer deposition process, CMP process, or etch-back process for forming a W-plug, and planarized through a patterning process, thereby forming the upper electrode II.

While the invention has been described in terms of a single preferred embodiment, those skilled in the art will recognize that the invention can be practiced with modifications within the spirit and scope of the appended claims.

There are advantages in a MIM capacitor of the present invention. The "Ti/TiN" or "Ti/TiW" deposition structure having a higher selective etching rate than an oxide layer replaces the conventional "TiN" single layer structure in order to form a capping metal layer of a lower electrode. The lower electrode obtains a tapered shape in the etching process through which a dielectric layer of equal thickness is formed along the edge of the via hole, thereby accomplishing improvements in product yield by preventing current leakage and short circuits between upper and lower electrodes caused by step coverage defects in the dielectric layer. Further, a capacitor of high reliability is achieved by preventing concentration of electric fields at particular portions of the dielectric layer.

What is claimed is:

1. A method for fabricating a capacitor of a semiconductor integrated circuit comprising the steps of:
   (a) forming a conductivity layer on a first inter-level insulating layer on a semiconductor substrate;
   (b) forming a capping metal layer from a "Ti/TiN" or "Ti/TiW" deposition structure on the conductivity layer where the capping metal layer has a higher selective etching rate than an oxide layer;
   (c) forming a lower electrode in a "conductivity layer/capping metal layer" deposition structure by selectively etching the capping metal layer and the conductivity layer to expose a predetermined part of the surface of the first inter-level insulating layer;
   (d) forming a second inter-level insulating layer on the first inter-level insulating layer having the lower electrode;
   (e) forming a via hole by selectively etching the second inter-level insulating layer and the lower electrode to a predetermined end point exposing a predetermined portion of the surface of the lower electrode, wherein a tapered capping metal layer remains along the lower edges at the closed end of the via hole; and
   (f) forming an upper electrode and inserting a dielectric layer in the via hole between the lower electrode and the upper electrode.

2. The method of claim 1, wherein the Ti is formed to between 50 to 500 Å.

3. The method of claim 1, wherein the TiN or TiW is formed to between 100 to 1500 Å.

4. The method of claim 1, wherein the capping metal layer is formed with a collimator containing a sputtering unit.

5. The method of claim 1, wherein the end point is located within the conductivity layer, thereby exposing a predetermined portion of the surface thereof.

6. The method of claim 1, wherein the end point is located at the center of the capping metal layer.

7. The method of claim 1, wherein the via hole is either dry etched or complex etched, which is a combination of wet and dry etching processes.

8. The method of claim 7, wherein the dry etching further comprises mixing etching gases $CHF_3:CF_4=1:X$, where $X=0.5$ to $2$.

9. The method of claim 1, wherein the via hole is formed at a distance along the plane of the closed end of the via hole between the edge of the via hole along the second inter-level insulating layer and the beginning of the taper of the capping metal layer along the closed edge of the via hole of between 100 to 800 Å.

10. The method of claim 1, wherein step (f) further comprises:
   (f1) forming a dielectric layer on the second inter-level insulating layer covering an internal portion of the via hole;
   (f2) forming a conductivity plug in the via hole;
   (f3) forming a second conductivity layer on the dielectric layer and the conductivity plug; and
   (f4) selectively etching the second conductivity layer and the dielectric layer in order to expose a predetermined portion of the surface of the second inter-level insulating layer, thereby completing the "conductivity plug/conductivity layer" deposition structure of the upper electrode.

11. The method of claim 10, wherein step (f2) further comprises:
   (f2a) forming a third conductivity layer on the dielectric layer and filling in the via hole; and
   (f2b) planarizing the third conductivity layer until the surface of the dielectric layer is exposed.

12. The method of claim 11, wherein the third conductivity layer comprises W.

13. The method of claim 11, wherein the third conductivity layer is planarized by one of a CMP process or an etch-back process.

14. The method of claim 11, further comprising a step of forming a blocking metal layer on the dielectric layer covering the internal portion of the via hole before forming the conductivity plug.

15. The method of claim 14, wherein the blocking metal layer comprises a "Ti/TiN" deposition structure.

16. The method of claim 1, wherein step (f) further comprises:
   (f1) forming a predetermined thickness of the dielectric layer on the second inter-level insulating layer covering the internal portion of the via hole;
   (f2) forming a second conductivity layer on the dielectric layer and filling in the via hole;
   (f3) re-flowing the second conductivity layer at a predetermined temperature; and
   (f4) selectively etching the second conductivity layer and the dielectric layer to expose a predetermined portion of the surface of the second inter-level insulating layer, thereby completing the upper electrode made of the second conductivity layer.

17. The method of claim 16, further comprising a step of forming a blocking metal layer on the dielectric layer covering the internal portion of the via hole before forming the second conductivity layer.

18. The method of claim 17, wherein the blocking metal layer is formed from a "Ti/TiN" deposition structure.

19. The method of claim 1, wherein the dielectric layer is formed from a single layer structure of an oxide or nitride layer, or a deposition structure combined with oxide and nitride layers.

20. The method of claim 19, wherein the oxide layer is formed by selecting one from the group of PEOX, P—$SiH_4$, HDP and $Al_2O_3$.

21. The method of claim 19, wherein the nitride layer comprises PESiN.

22. The method of claim 19, wherein the deposition structure is formed by selecting one from the group of "oxide layer/nitride layer," "nitride layer/oxide layer," "oxide layer/nitride layer/oxide layer," and "nitride layer/oxide layer/nitride layer" deposition structures.

* * * * *